United States Patent [19]
Dormer et al.

[11] Patent Number: 5,989,354
[45] Date of Patent: Nov. 23, 1999

[54] METHOD FOR REMOVING THIN, ORGANIC MATERIALS FROM SEMICONDUCTOR DIES AND MICRO-LENSES

[75] Inventors: James F. Dormer, Limekiln; John W. Osenbach, Kutztown, both of Pa.

[73] Assignee: Lucent Technologies, Inc., Murray Hill, N.J.

[21] Appl. No.: 08/996,417

[22] Filed: Dec. 22, 1997

[51] Int. Cl.⁶ ............... C03C 23/00; C03C 1/02; B08B 7/00
[52] U.S. Cl. ................. 134/2; 134/1.3; 134/3
[58] Field of Search ............ 134/1.3, 2, 3, 26, 134/28, 29, 38, 40

[56] References Cited

U.S. PATENT DOCUMENTS

| | | | |
|---|---|---|---|
| 4,011,144 | 3/1977 | Bachman | 438/611 |
| 4,880,601 | 11/1989 | Andermann et al. | 422/28 |
| 5,110,765 | 5/1992 | Bilakanti et al. | 438/500 |
| 5,462,638 | 10/1995 | Datta et al. | 438/695 |
| 5,466,389 | 11/1995 | Iiardi et al. | 510/175 |
| 5,491,091 | 2/1996 | Loshaek et al. | 422/28 X |

OTHER PUBLICATIONS

CA abstract of JP 62–245526, Oct. 1987.

*Primary Examiner*—Jill Warden
*Assistant Examiner*—Alexander Markoff
*Attorney, Agent, or Firm*—Synnestvedt & Lechner LLP

[57] ABSTRACT

The invention is a method for removing organic and other contaminants, such as photo-resist, from semi-conductor dies and micro-lenses by placing the dies in a solution of two parts ethylene, diamine tetra-acetic-acid (EDTA) to one part peroxide at a temperature of between 30° and 55° C., and preferably between 40° and 44° C., for a period of 1–30 minutes, and preferably between 2 and 10 minutes.

80 Claims, 2 Drawing Sheets

METHOD FOR REMOVING THIN, ORGANIC MATERIALS FROM SEMICONDUCTOR DIES AND MICRO-LENSES

FIELD OF THE INVENTION

The invention pertains to the fabrication of semiconductor chips and the assembly of optical lenses to said chips. More particularly, the invention pertains to a method for safely and efficiently removing organic materials from optical bench semi-conductor dies.

BACKGROUND OF THE INVENTION

During the fabrication of semi-conductor chips, organic materials, such as photo-resist commonly are used to coat the surface of the chip. The process of patterning a silicon wafer or other microelectronic substrate involves coating the substrate with photo-resist, and shining UV radiation through a mask that defines the pattern of interest onto the wafer. In the case of positive photo-resist, the portion of the photo-resist that was exposed to the radiation through the mask is then stripped away in a solution that dissolves the exposed photo-resist while not significantly affecting the unexposed photo-resist. With the mask shape so etched in the photo-resist material, the particular material to be implanted, etched or deposited on the wafer in the pattern dictated by the mask can be so implanted, etched or deposited.

After the material is on the wafer, the remaining photo-resist is removed in a different solution that is effective for stripping unexposed photo-resist. Many such solutions for stripping exposed photo-resist off of a wafer are known, including acetone and isopropyl alcohol.

Throughout an entire fabrication process for a semiconductor chip, photo-resist may be deposited and stripped a way many times using many different masks. As a wafer moves through the fabrication process, having more and more of its features embedded therein (e.g., dopants, metallizations, bond pads, protective coatings, etc.), the solution used for washing away progressive photo-resist layers must be more and more carefully selected. Particularly, as more materials become part of the chip, the photo-resist stripping solution must be carefully selected so as not to adversely affect any of the materials which have been incorporated into the chip.

For instance, in a silicon optical bench sub-assembly chip (SiOB chip) such as illustrated in FIG. 1, near the end of the fabrication process, the die contains a number of exposed materials. For instance, FIG. 1 illustrates the exposed materials on a particular SiOB die manufactured by Lucent Technologies, Inc. (see e.g., U.S. patent application Ser. No. 08/764,960 filed Dec. 22, 1995). This die is the optical bench die used in the Laser 2000 series of products offered by Lucent Technologies, Inc. of Murray Hill, N.J., the assignee of the present invention. As shown, the silicon is coated with, at least, (1) aluminum, (2) a sandwich of titanium, platinum and gold (Ti/Pt/Au), and (3) silicon dioxide ($SiO_2$).

At the end of wafer production, the wafer is separated (or diced) into the separate dies. In the case of the die for the aforementioned SiOB chip of Lucent Technologies as well as many other dies, a final coating of photo-resist is applied over the entire wafer (with no mask) in order to protect it during the sawing operation. In particular, a common way of dicing a wafer is to cut it into the individual dies with a water cooled, diamond tipped, precision saw. This final layer of photo-resist is applied without mask so that it completely coats the wafer. The purpose of this final layer of photo-resist is to protect the surface of the dies from the water and/or silicon dust which will be thrown up during the sawing operation.

After the sawing operation, the photo-resist must be removed from the individual dies completely and without harming any of the components and features on the die.

Residual photo-resist that was not completely removed from the die can lead to several problems. One of the most notable is that residual photo-resist can lead to leakage currents or short circuits between electrical contact paths on the surface of the substrate which should be electrically isolated from each other. Residual photo-resist is particularly problematic when it is subjected to heat and becomes charred (carbonized). When carbonized, the electrical impedance of the photo-resist decreases, thus increasing the severity of leakage currents and shorts. Accordingly, residual photo-resist can substantially reduce chip yields.

Many chips are fabricated for opto-electronic applications. As the name implies, optical bench dies are basic building blocks of such opto-electronic chips. Optical bench dies are fabricated with various features to allow them to have multiple potential uses in the optical or opto-electronic applications depending on the components mounted thereon. For instance, an optical bench die may include a micro-machined cavity for placement of a micro-lens for focusing laser light. It also may be provided with mounting pads for mounting a laser diode and/or a photo detector. One such exemplary silicon optical bench die is the die use in the Laser 2000 series of products offered by Lucent Technologies, Inc., the assignee of the present application. That die, for example, has a micro-machined cavity designed to accept a micro-lens for focusing the light of a laser diode which can be mounted on a particular mounting pad on the surface of the die. The lens is bonded to an exposed aluminum layer deposited on the chip in the lens cavity. The lens itself may be made of several possible materials. One example of such material is Spinnel™. The lens is bonded to the aluminum layer via a silicon dioxide coating on the lens in a process that is commonly termed AlO (aluminum oxide) bonding. Particularly, during fabrication, a chemical reaction is caused to occur that bonds the silicon dioxide layer on the lens to the aluminum on the die thus fixing the lens in the cavity (see e.g., Coucoulas, et al., 43rd ECTC Proceeding, 471–481 (1993).

During fabrication of the lens itself, various contaminants may come to be attached to the surface of the silicon dioxide layer on the lens. Such contaminants may include organic polymers such as photo-resist, oils, carbon particles, and airborne particles, among other things. While contaminants during fabrication of micro-electronic or micro-optical devices are always undesirable, they are particularly troublesome with respect to micro-lenses. Specifically, any contaminant on the surface of the silicon dioxide of the lens will reduce the efficacy of the bonding of the lens to the aluminum layer in the cavity. Accordingly, it is desirable to wash the lens just prior to bonding on the cavity in a solution which will remove the potential contaminants without affecting the silicon dioxide layer on the lens. Similarly, contaminants on the aluminum surface will also reduce the efficacy of the lens to aluminum bond.

Therefore, it is an object of the present invention to provide a safe and efficient method for removing the photo-resist from semi-conductors.

It is another object of the present invention to provide a safe and efficient method of cleaning micro-optical lenses.

SUMMARY OF THE INVENTION

The invention is a method for washing photo-resist and other organic materials off of semi-conductor dies and micro-lenses. The method comprises the steps of placing the dies and/or lenses in a solution of ethylene, diamine, tetra-acetic-acid (EDTA) and peroxide at a temperature and time period optimized to effectively remove photo-resist and/or other contaminants, but not significantly affect any other materials on the die or lens.

In a preferred embodiment, a solution of two parts EDTA (Aldrich Chemical or Ashland Chemical) to one part peroxide is mixed in a vessel comprised of a neutral material such as glass and placed in an ultrasonic tank at 42° C. The solution is mixed with a magnetic stirrer and is used within one-half hour of mixing. The die and/or lens is placed in the solution for eight minutes. Preferably, the apparatus for holding the die/lens is formed of a material that is not affected by the solution and that will not set up an electrolytic potential with the die/lens. TEFLON is one such preferred material. In a preferred embodiment of the invention, a different batch of the solution is used for every sequential group of dies/lenses.

DETAILED DESCRIPTION OF PREFERRED EMBODIMENTS OF THE INVENTION

Figure 1:
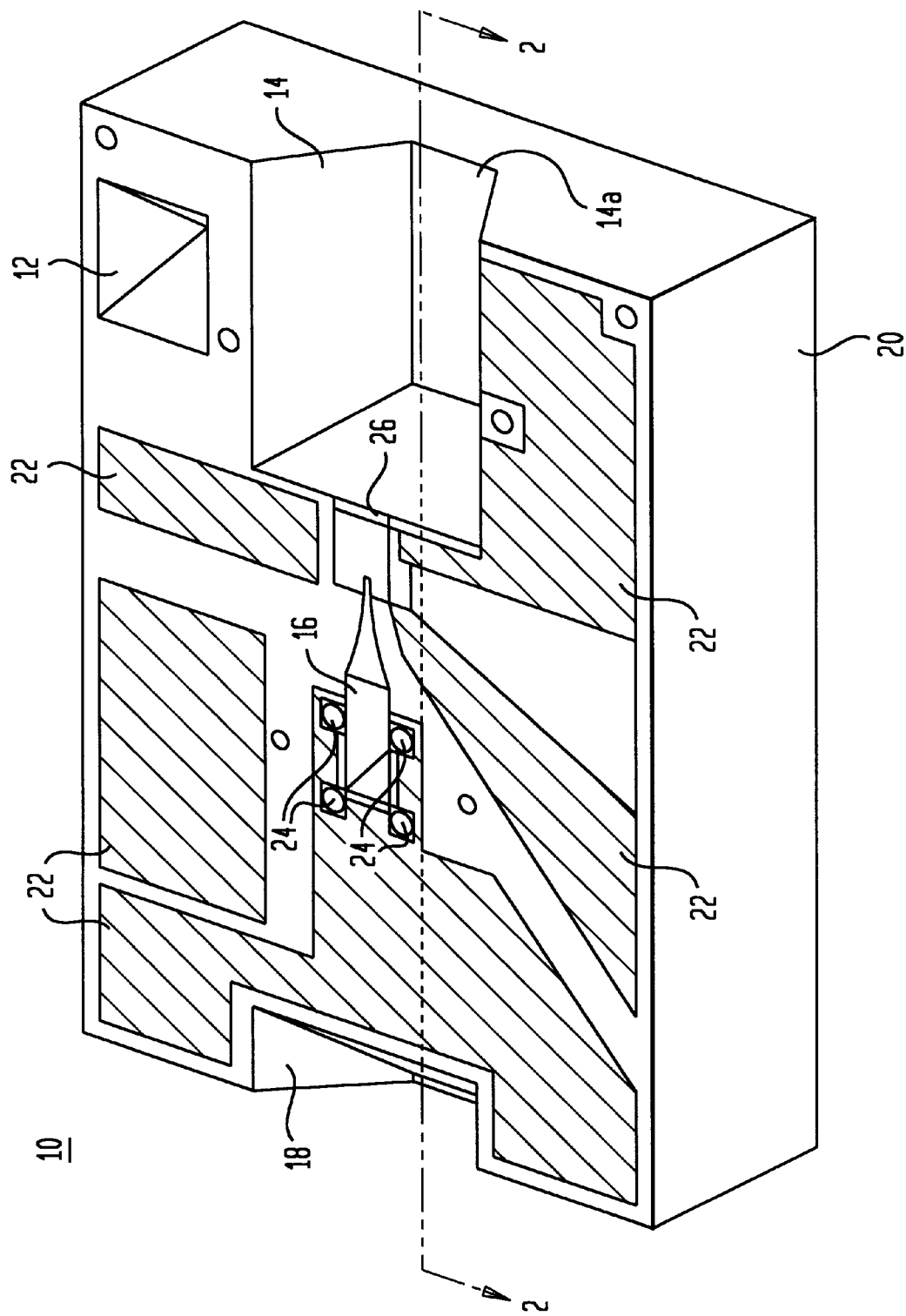
FIG. 1 is a perspective view of an exemplary semiconductor die which may be treated in accordance with the present invention.

FIG. 1 is a perspective view of a silicon optical bench (SiOB) micro-machined die. The die is termed an optical bench because, depending on what components are mounted thereon and the manner in which it is interconnected with other systems, it is widely adaptable to various uses such as an optical receiver, transmitter, or transceiver. The particular exemplary die shown in FIG. 1 is the SiOB die that is the basis for the Laser 2000 series of products offered by Lucent Technologies, Inc. of Murray Hill, N.J. The die 10 includes four micro-machined cavities 12, 14, 16 and 18. Cavities 14 and 18 are actually formed as a single cavity during wafer fabrication. However, the wafer is diced to form individual dies by sawing through the cavity such that the cavity is split into two portions, with the portion defined by cavity 14 being at one end of a die and the portion defined by cavity 18 being at the opposite end of the succeeding die.

The die substrate 20 is silicon. The cross-hatched portions on the surface are metallizations 22 forming conductors. The metallizations 22 are comprised of a three-layer sandwich of titanium on the bottom, platinum in the middle, and gold on the top. Mounting pads 24 and 26 are provided for mounting components, such as a laser diode, onto the surface of the die 10, as explained more fully below. Cavity 14 is positioned, sized, and shaped to accept a micro-lens for focusing the light radiated from a laser diode mounted on pad 26. When the die 10 is packaged, the open end 14a of cavity 14 will be adjacent a light outlet port on the edge of the chip for coupling light generated by the laser diode mounted on pad 26 to external circuitry.

Figure 2:
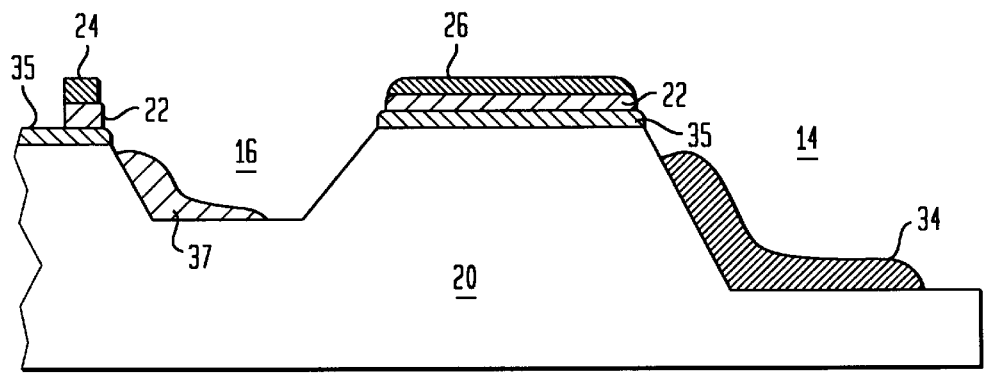
FIG. 2 is a cross-sectional view of the unpopulated die of FIG. 1 taken along line 2—2 before it has been populated with components.

FIG. 2 is a cross-sectional view taken along line 2—2 in FIG. 1. As shown, the SiOB die 10 is comprised of a substrate of silicon 20. Cavity 14 is coated with an aluminum metallization layer 34. As described in more detail below, the aluminum layer is placed in the cavity for purposes of bonding a micro-lens 44 in cavity 14. A 5000 angstrom thick layer of silicon dioxide ($SiO_2$) 35 is deposited on the top surface of the die between metallizations and the silicon to provide improved electrical isolation therebetween.

Metallizations 22 are formed of a triple layer of titanium, platinum, and gold. The lower most layer is the titanium (Ti) layer. Titanium bonds very well to silicon dioxide and to platinum. The platinum (Pt) layer is bonded to the top of the titanium layer and acts as an insulator between the titanium and the gold. Particularly, titanium and gold will react with each other if placed in direct contact. The gold (Au) layer on top is the conductive layer for the contacts. To prevent Ti and Pt reactions, it is sometimes advantageous to insert a thin (500 angstroms) titanium nitride layer between the Ti and Pt layers. At the edges of the metallizations, the underlying titanium and platinum layers are exposed.

In the Laser 2000 SiOB die, cavity 16 also is coated with a metallization 37 of titanium, platinum, and gold. This metallization is used as a turning mirror; gold being highly reflective.

Figure 3:
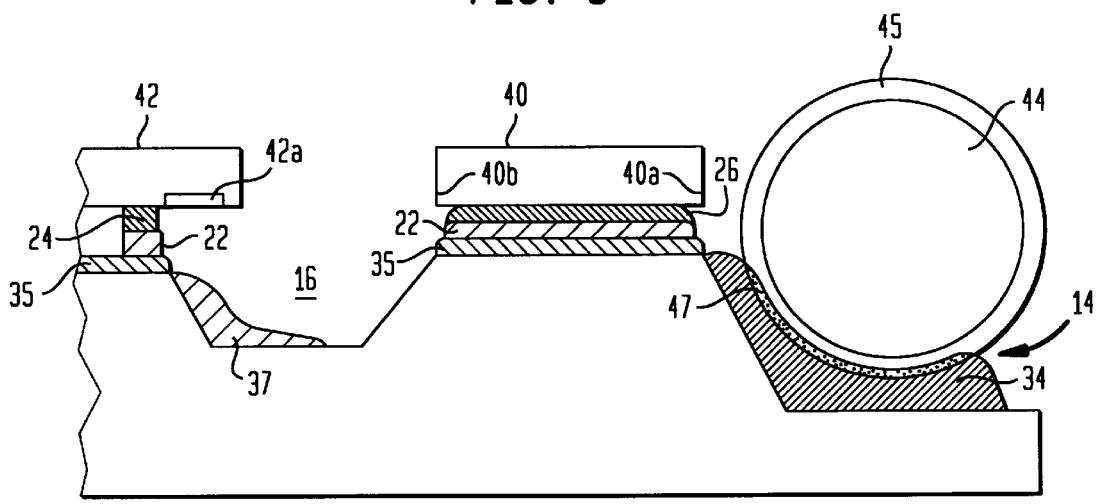
FIG. 3 is a cross-sectional view of the die of FIGS. 1 and 2 after it has been populated with optical components.

FIG. 3 is a cross-sectional view similar to that of FIG. 2, except showing the populated die with additional optical components mounted on it. In this particular embodiment, the die will be embodied in a chip configured as an optical transmitter. Lens 44 is bonded within cavity 14 by aluminum oxide (AlO) bonding. In particular, the lens 44 is coated with a layer 45 of silicon dioxide ($SiO_2$) which will bond strongly with the aluminum layer 34 when brought in contact therewith under heat and pressure. Particularly, when the aluminum comes in contact with the $SiO_2$ of the lens under heat and pressure, an aluminum oxide bond (AlO) 47 is formed from the reduction of $SiO_2$ by Al, thus bonding the lens to the die. In theory, a similar metal oxide type bond can be formed between any metal (e.g., Al) and any metal oxide (e.g., $SiO_2$) for which the metal oxide ($SiO_2$) is less thermodynamically stable than the oxide form (e.g., AlO) of the original metal.

A laser diode 40 is mounted on mounting pad 26 via a bonding layer of Au/Sn (gold/tin). Pads 24 also is comprised of Au/Sn. A photo diode 42 is mounted on pad 24. Laser diode 40 has a front output facet 40a and a rear output facet 40b through which the laser light generated within the diode 40 escapes. Front facet 40a is the main light output port and is used for the transmission of data. Rear facet 40b emits a substantially attenuated amount of light relative to front facet 40a, but the amount is directly proportional to the amount of light emitted from the front facet 40a. The light exiting the laser at front end 40a enters the lens, and is focused. When the die is packaged in a chip package, the opposite end of lens 44 will be positioned adjacent a light output port of the chip for coupling of the light to external circuitry.

Because the current to light ratio of a laser diode can drift over time, it is desirable to monitor the light output power of the laser relative to the input current. The monitored light is then used to adjust the current input levels to the laser diode 40 to maintain constant light output power levels. The light emitted from the rear output facet 40b of laser diode is used for this monitoring purpose. Particularly, the reflectivity of the rear output facet is designed to be much higher than the reflectivity of the front output facet. Accordingly, the amount of light emanating from rear output facet 40b is less than, but proportional to, the amount emitted from front face 40a. Therefore, it can be used to monitor the output power (the amount of light output from the front output port) of the laser diode. Photo diode 42 is positioned to receive a portion of the light emitted from rear port 40b of laser diode 40. In particular, photo diode 42 has a detection area 42a located on its bottom surface over cavity 16. As previously noted, cavity 16 is coated with a highly reflective gold coating which reflects the light up into detection face 42a. Photo diode 42 generates a current proportional to the amount of light detected. That current is used to determine the light output power of the laser and is used for one or more diagnostic or adjustment purposes.

Towards the end of the fabrication process for the SiOB die illustrated in FIGS. 1 and 2, the entire wafer is coated with photo-resist, without masking, in order to protect the entire wafer surface from contamination or damage during dicing of the wafer into individual dies. Particularly, a wafer is commonly diced into individual dies by sawing along the streets defining the edges of the dies with a diamond tipped, water cooled, precision micro-saw. The sawing operation cuts through the silicon and sends up a cloud of silicon dust particles which could contaminate an unprotected wafer.

Silicon dust on the dies is undesirable because it can lead to several problems. First, silicon dust particles that settle on bonding pad locations can adversely affect the strength of the bond that can be formed. Further, silicon dust particles on the turning mirror can create scattering of light, thus altering the reflectivity characteristics of the turning mirror. More particularly, dust particles can move over time, causing the reflectivity of the turning mirror to change during operation leading to failure of the chip.

The problem of silicon dust getting on the surface of the die during dicing is particularly troublesome with respect to dies with deep micro-machined cavities, such as the SiOB dies discussed herein because it is difficult to clean out the deep cavities. The photo-resist coating protects the wafer from coming into contact with the silicon dust.

After the wafer is completely diced into the individual dies, the photo-resist must be removed. Normal photo-resist stripping agents or solutions cannot be used at this stage with respect to many dies, including the afore-described SiOB dies because of the presence of gold and aluminum on the dies. Particularly, standard photo-resist stripping solutions are electrolytic in nature. There is a potential drop of approximately 2.5 to 3 volts between gold and aluminum in an electrolytic solution. Accordingly, placing the SiOB dies in a standard electrolytic photo-resist stripping agent will cause the aluminum to corrode, i.e., will cause an excessive amount of aluminum oxide to form on the surface of any aluminum on the die. Similar electro-chemical corrosion could occur for other dissimilar metallizations such as tungsten (W) and Aluminum, copper (Cu) and Al, etc.

Excessive aluminum oxide thickness will inhibit the ability to form an AlO bond between the lens 44 and the aluminum in cavity 14. In order for the lens to bond to the aluminum as described above, the $SiO_2$ on the surface of the lens must contact the aluminum on the surface of the cavity 14. However, a thick layer of AlO on the surface of the aluminum will substantially prevent the necessary contact.

It has been found that shear strengths, of the lens to Al bond of at least twenty to thirty grams (as measured by industry standard techniques) are necessary to reasonably assure that the lens/die bond will not fail during normal use. It also has been found that the bond strength of the lens to the die using AlO bonding with native aluminum oxide thickness ($\leq$30 angstroms) on the surface of the aluminum that forms as a result of exposure of the aluminum to air yields bond strengths of approximately 200 grams. At a thickness of about 100 angstroms aluminum oxide, which might commonly be created by anodic oxidation (corrosion) of the aluminum when standard photo-resist strippers are used, the bond strength drops to an unacceptably low level of approximately 10 grams.

Accordingly, some fabricators have used acetone for stripping the final photo-resist layer after dicing of the wafers. Acetone is not electrolytic and, therefore, does not lead to the growth of significant AlO thicknesses on aluminum surfaces on the dies. However, acetone does not strip photo-resist as efficiently as standard photo-resist strippers. In particular, acetone works reasonably well if the photo-resist has not been exposed to UV radiation or has not had time to dry. However, if the photo-resist either is exposed to UV radiation or dries out, acetone stripping tends to leave some residue photo-resist on the die. Preventing exposure of the chips to UV radiation requires extremely tight environmental controls and is frequently virtually impossible. Any organic residue, such as photo-resist, will decrease bonding efficiency of the lens to the aluminum. Specifically, any part of the die which is coated with residue photo-resist will prevent contact between the die material, for example, aluminum, and the object to be bonded to it, e.g., the silicon dioxide coating on the lens. The same is generally true for other types of bonding.

Also, residue photo-resist that spans two portions of the chip which are supposed to be electrically isolated from each other leads to leakage current between the two components. Accordingly, yields tend to be unacceptably low when using acetone as a photo-resist stripping agent. The problem is particularly aggravated when a die bearing residue photo-resist is exposed to heat, such as when objects are bonded to the chip using heat and/or a reducing atmosphere. Particularly, residual photo-resist can be charred (carbonized) by the application of heat and reducing atmosphere. The carbonization of the photo-resist increases its conductivity, thus making shorting and leakage currents more prevalent.

Thus, for instance, a chip may PASS quality control testing after fabrication and prior to bonding of other components, such as photo diode 42 or laser diode 44. However, after those components are bonded to the chip in a bonding operation utilizing heating, the chip may then FAIL. This, not only decreases yield on the chips, but also wastes good photodetector diodes and laser diodes which have been mounted on the die and cannot economically be removed.

The present invention is a method for stripping photo-resist from chips, such as the SiOB chips described herein that avoids the above-described problems in the prior art. In accordance with the invention, photo-resist is first exposed to acetone to strip the bulk of the photo-resist. A one hour exposure at room temperature is sufficient to remove the bulk of the photo-resist for thicknesses $\leq$10 microns. This is followed by exposure to a solution of peroxide and ethylene diamine tetra-acetic-acid (EDTA) to remove the residual photo-resist.

EDTA is known as an etching agent for titanium at high temperatures (in the range of about 60–75° C.). It has not heretofore been used for photo-resist stripping.

In particular, a solution of two parts EDTA to one part peroxide is mixed immediately prior to stripping. Exposed peroxide has a short shelf life due to oxidation and general degradation. It has been found that the solution in a normal indoor environment is optimally effective for this process for only approximately one-half hour. The solution should be mixed in a glass beaker, preferably Pyrex™. A polymer beaker is not recommended due to the possibility of chemical reactions between the beaker polymer material and the solution. The solution should be well stirred, preferably with a magnetic stirrer. Also in a preferred embodiment, the solution is placed in an ultrasonic tank. The ultrasonic waves agitate the solution and increase its effervescence, thus helping speed the stripping of the residual photo-resist. The solution is brought to a temperature of between 30 and 55° C. and preferably between a temperature of 40 and 44° C. Most preferably, the temperature is 42° C.

The individual dies should be placed in a bin constructed of a material that is not affected by the solution and does not set up an electrolytic potential with the dies. TEFLON has been found to be adequate. It also has been found that placing the dies in the TEFLON bin with the micromachined cavities facing down leads to the most efficient stripping, presumably due to the effervescent bubbles having a generally upward movement. The dies should be left in the solution for a period of two to thirty minutes and more preferably, a period of approximately eight minutes. The process has been found to work well using these parameters at room temperature and humidity levels. However, in a more controlled environment, the solution may be effective for a longer period of time than one-half of an hour.

It has been found that temperature has the most significant impact on the effectiveness of the residual photo-resist stripping. Particularly, as the temperature increases the photo-resist strips faster. However, the temperature must be optimized not only relative to the photo-resist stripping efficiency, but also to the fact that the EDTA/peroxide solution etches titanium. Accordingly, die exposure to the stripping solution for too long a period of time or at too high of a temperature may strip away the titanium which is exposed at the edges of the titanium/platinum/gold metallizations on the chip. Excessive stripping of the titanium at the edges of the Ti/Pt/Au metallizations could lead to pealing away of the metallizations at the edges. It has been found that, at temperatures above 55° C., the titanium etches at a rate of approximately 250–500 angstroms per minute. In most situations, this etch rate is too fast for photo-resist stripping in connection with dies bearing titanium. Below 35° C., titanium etching is immeasurably small. However, photo-resist stripping effectiveness and speed also is reduced. A temperature of 42°±2° has been found to provide a good balance between titanium etching and residual photo-resist stripping. Particularly, at approximately 42° C., titanium etches at a very slow rate of approximately 36 angstroms per minute. At this temperature, eight minutes of exposure provides excellent stripping of photo-resist with minimal stripping of titanium.

Preferably, a plurality of chips are stripped simultaneously by use of a TEFLON bin which can hold a number of dies in separate chambers. While the solution may be re-used for another batch of dies, it is preferable to mix-up a new batch for each operation, due to the rapid degradation of peroxide when exposed to oxygen, light and humidity. For instance, at 35° C., approximately one hour is necessary to obtain adequate residual photo-resist stripping. If, for any reason, it is necessary to use such low temperatures, it is preferable to use two separate batches of the solution sequentially since the peroxide will likely degrade significantly after half an hour.

Those skilled in the art will recognize that such a process could be extended to include wafer scale photo-resist stripping.

The useful life of the peroxide in the peroxide/EDTA solution can be increased by tighter control of the environment and, particularly, oxygen content. However, it has been found that room humidity conditions are adequate as long as the solution temperature is maintained above approximately 40°. Thus, the expense of maintaining a controlled environment is avoided.

In accordance with the invention, the lens also preferably is washed in the same solution of two parts EDTA to one part peroxide. Particularly, during fabrication and handling of the lenses, the lenses may become contaminated with any number of potential contaminants. Potential contaminants include organic materials such as photo-resist, oils, and airborne contaminants such as dust. In order to assure the best bonding properties of the silicon dioxide layer on the lens to the aluminum in cavity 14, there should be as few contaminants as possible on the lens surface. The lenses should be washed in essentially the same manner as described above with respect to the dies. The only significant difference is that, since there is no titanium associated with the lenses, there is essentially no maximum time limit that the lenses can stay in the solution. However, it has been found that at 42° C., a lens having a 800 angstrom diameter is adequately cleaned after two minutes. In a preferred embodiment of the invention, the lens is in solution for approximately eight minutes.

Those skilled in the art will recognize that such a cleaner would also be useful on other oxide lens materials.

EDTA is presently commonly used for etching titanium in integrated circuit fabrications. Titanium etching with EDTA/peroxide solution typically is performed at approximately 65° C., where titanium etching occurs relatively quickly, i.e., at rates of 250–500 angstroms per minute and greater. In embodiments where the devices are placed in a solution for more than half an hour, either the environment must be closely controlled to reduce the rate of peroxide degradation or the stripping can occur in two or more separate baths sequentially.

EDTA photo-resist stripping generally can be used for any type of optical chip including optical benches and planar laser wave guides. In fact, the process disclosed herein can be used to strip photo-resist at any phase of fabrication of essentially any die.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

We claim:

1. A method of cleaning contaminants from a semiconductor device comprising the steps of:

provide a solution of ethylene, diamine, tetra-acetic-acid (EDTA) and peroxide in a ratio of about two parts EDTA to one part peroxide; and introducing said semiconductor device into said solution.

2. A method as set forth in claim 1 further comprising the step of:

bringing said solution to a temperature of between about 30° Celsius (C.) and 55° C.

3. A method set forth in claim 1 further comprising the step of:

bringing said solution to a temperature of between about 40° C. and 44° C.

4. A method as set forth in claim 1 further comprising the step of:

bringing said solution to a temperature of about 42° C.

5. A method as set forth in claim 2 further comprising the step of causing said semiconductor device to remain in said solution for a period of between about 1 to 30 minutes.

6. A method as set forth in claim 5 further comprising the step of causing said semiconductor device to remain in said solution for a period of between about 6–10 minutes.

7. A method as set forth in claim 6 further comprising the step of causing said semiconductor device to remain in said solution for a period of about 8 minutes.

8. A method as set forth in claim 5 further comprising the step of:

agitating said solution.

9. A method as set forth in claim 8 wherein said agitating step comprises ultrasonically agitating said solution.

10. A method as set forth in claim 9 wherein said agitating step comprises ultrasonically agitating said solution for the time period that said semiconductor device is in said solution.

11. A method as set forth in claim 5 wherein said step of providing said solution comprises creating said solution and wherein said method is completed within 30 minutes.

12. A method as set forth in claim 5 further comprising the step of:

maintaining said solution at an approximately constant temperature during the period that said semiconductor device is in said solution.

13. A method as set forth in claim 12 wherein said maintaining step comprises maintaining said temperature within ±2° C. of said constant temperature.

14. A method as set forth in claim 5 wherein said period and said temperature are selected relative to each other such that no significant removal of titanium from said semiconductor device will occur.

15. A method as set forth in claim 5 wherein said period and said temperature are selected relative to each other to provide a titanium etch rate of less than about 200 angstroms per minute.

16. A method as set forth in claim 5 wherein said period and said temperature are selected relative to each other to provide a titanium etch rate of less than about 50 angstroms per minute.

17. A method as set forth in claim 2 wherein said semiconductor device comprises a cavity and said introducing step comprises introducing said semiconductor in said solution with said cavity facing downward.

18. A method as set forth in claim 6 wherein said semiconductor device comprises a cavity and said introducing step comprises introducing said semiconductor in said solution with said cavity facing downward.

19. A method as set forth in claim 2 wherein said introducing step comprises;

placing said semiconductor device in a polytetrafluoroethylene container; and placing said container in said solution.

20. A method of cleaning contaminants from a micro lens comprising the steps of:

providing a solution of ethylene, diamine, tetra-acetic-acid (EDTA) and peroxide in a ratio of about two parts EDTA to one part peroxide; and introducing said micro lens into said solution.

21. A method set forth in claim 20 wherein said micro lens is coated with a metal oxide.

22. A method as set forth in claim 20 wherein said micro lens is coated with silicon dioxide.

23. A method as set forth in claim 21 wherein said micro lens is coated with a metal oxide for metal oxide bonding to a semiconductor device.

24. A method as set forth in claim 20 wherein said micro lens is coated with silicon dioxide for aluminum oxide bonding to a semiconductor device.

25. A method as set forth in claim 20 further comprising the step of:

bringing said solution to a temperature of between about 30° Celsius (C.) and 55° C.

26. A method as set forth in claim 20 further comprising the step of:

bringing said solution to a temperature of between about 40° C. and 44° C.

27. A method as set forth in claim 21 further comprising the step of:

bringing said solution to a temperature of about 42° C.

28. A method as set forth in claim 25 further comprising the step of:

causing said micro lens to remain in said solution for a period of between about 1 to 30 minutes.

29. A method as set forth in claim 28 wherein said step of causing said micro lens to remain in said solution comprises causing said micro lens to remain in said solution for a period of at least about 2 minutes.

30. A method as set forth in claim 29 wherein said step of causing said micro lens to remain in said solution comprises causing said semiconductor device to remain in said solution for a period of about 8 minutes.

31. A method as set forth in claim 28 further comprising the step of:

agitating said solution.

32. A method as set forth in claim 31 wherein said agitating step comprises ultrasonically agitating said solution.

33. A method as set forth in claim 32 wherein said agitating step comprises ultrasonically agitating said solution for the time period that said semiconductor device is in said solution.

34. A method as set forth in claim 25 wherein said method is completed within 30 minutes.

35. A method as set forth in claim 25 further comprising the step of:

maintaining said solution at an approximately constant temperature during the period that said semiconductor device is in said solution.

36. A method as set forth in claim 35 wherein said maintaining step comprises maintaining said temperature within ±2° C. of said constant temperature.

37. A method of stripping photoresist from a semiconductor device comprising the steps of:

providing a solution of ethylene, diamine, tetra-acetic-acid (EDTA) and peroxide in a ratio of about two parts EDTA to one part peroxide; and introducing said semiconductor device into said solution.

38. A method as set forth in claim 37 further comprising the step of:

bringing said solution to a temperature of between about 30° Celsius (C.) and 55° C.

39. A method as set forth in claim 37 further comprising the step of:

bringing said solution to a temperature of between about 40° C. and 44° C.

40. A method as set forth in claim 37 further comprising the step of:

bringing said solution to a temperature of about 42° C.

41. A method as set forth in claim 38 further comprising the step of:

causing said semiconductor device to remain in said solution for a period of between about 1 to 30 minutes.

42. A method as set forth in claim 41 wherein said step of causing said semiconductor device to remain in said to solution comprises causing said semiconductor device to remain in said solution for a period of between about 6–10 minutes.

43. A method as set forth in claim 41 wherein said step of causing said semiconductor device to remain in said solution comprises causing said semiconductor device to remain in said solution for a period of about 8 minutes.

44. A method as set forth in claim 38 further comprising the step of:

agitating said solution.

45. A method as set forth in claim 44 wherein said agitating step comprises ultrasonically agitating said solution.

46. A method as set forth in claim 45 wherein said agitating step comprises ultrasonically agitating said solution for the time period that said semiconductor device is in said solution.

47. A method as set forth in claim 41 wherein said step of providing said solution comprises creating said solution and wherein said method is completed within 30 minutes.

48. A method as set forth in claim 38 further comprising the step of:

maintaining said solution at an approximately constant temperature during the period that said semiconductor device is in said solution.

49. A method as set forth in claim 48 wherein said maintaining step comprises maintaining said temperature within ±2° C. of said constant temperature.

50. A method as set forth in claim 41 wherein said period and said temperature are selected relative to each other such that no significant removal of titanium from said semiconductor device will occur.

51. A method as set forth in claim 50 wherein said period and said temperature are selected relative to each other to provide a titanium etch rate of less than about 200 angstroms per minute.

52. A method as set forth in claim 51 wherein said period and said temperature are selected relative to each other to provide a titanium etch rate of less than about 50 angstroms per minute.

53. A method as set forth in claim 38 wherein said semiconductor device comprises a cavity and said introducing step comprises placing said semiconductor in said solution with said cavity facing downward.

54. A method as set forth in claim 42 wherein said semiconductor device comprises a cavity and said introducing step comprises placing said semiconductor in said solution with said cavity facing downward.

55. A method as set forth in claim 42 wherein said introducing step comprises;

placing said semiconductor device in a polytetrafluoroethylene container; and placing said container in said solution.

56. A method as set forth in claim 37 wherein said semiconductor comprises exposed aluminum.

57. A method as set forth in claim 38 wherein said semiconductor comprises titanium.

58. A method as set forth in claim 55 wherein said semiconductor comprises titanium.

59. A method of stripping photoresist from a silicon optical bench semiconductor device comprising the steps of:

providing a solution of ethylene, diamine, tetra-acetic-acid (EDTA) and peroxide in a ratio of about two parts EDTA to one part peroxide; and introducing said semiconductor device into said solution.

60. A method as set forth in claim 56 further comprising the step of:

bringing said solution to a temperature of between about 30° Celsius (C.) and 55° C.

61. A method as set forth in claim 56 further comprising the step of:

bringing said solution to a temperature of between about 40° C. and 44° C.

62. A method as set forth in claim 56 further comprising the step of:

bringing said solution to a temperature of about 42° C.

63. A method as set forth in claim 60 further comprising the step of;

causing said silicon optical bench to remain in said solution for a period of between about 1 to 30 minutes.

64. A method as set forth in claim 63 wherein said step of causing said silicon optical bench to remain in said solution comprises causing said silicon optical bench to remain in said solution for a period of between about 6–10 minutes.

65. A method as set forth in claim 63 wherein said step of causing said silicon optical bench to remain in said solution comprises causing said silicon optical bench to remain in said solution for a period of about 8 minutes.

66. A method as set forth in claim 60 further comprising the step of:

agitating said solution.

67. A method as set forth in claim 66 wherein said agitating step comprises ultrasonically agitating said solution.

68. A method as set forth in claim 67 wherein said agitating step comprises ultrasonically agitating said solution for the time period that said silicon optical bench is in said solution.

69. A method as set forth in claim 63 wherein said step of providing said solution comprises creating said solution and wherein said method is completed within 30 minutes.

70. A method as set forth in claim 60 further comprising the step of:

maintaining said solution at an approximately constant temperature during the period that said silicon optical bench is in said solution.

71. A method as set forth in claim 69 wherein said maintaining step comprises maintaining said temperature within ±2° C. of said constant temperature.

72. A method as set forth in claim 63 wherein said period and said temperature are selected relative to each other such that no significant removal of titanium from said silicon optical bench will occur.

73. A method as set forth in claim 72 wherein said period and said temperature are selected relative to each other to provide a titanium etch rate of less than about 200 angstroms per minute.

74. A method as set forth in claim 73 wherein said period and said temperature are selected relative to each other to provide a titanium etch rate of less than about 50 angstroms per minute.

75. A method as set forth in claim 60 wherein said semiconductor device comprises a cavity and said introducing step comprises placing said semiconductor in said solution with said cavity facing downward.

76. A method as set forth in claim 64 wherein said semiconductor device comprises a cavity and said introducing step comprises placing said semiconductor in said solution with said cavity facing downward.

77. A method as set forth in claim 65 wherein said introducing step comprises;

placing said semiconductor device in a polytetrafluoroethylene container; and placing said container in said solution.

78. A method as set forth in claim 60 wherein said silicon optical bench comprises exposed aluminum.

79. A method as set forth in claim 60 wherein said silicon optical bench comprises titanium.

80. A method as set forth in claim 78 wherein said silicon optical bench comprises titanium.

\* \* \* \* \*